United States Patent [19]

Rando

[11] Patent Number: 4,601,452
[45] Date of Patent: Jul. 22, 1986

[54] LASER DIODE MOUNTING SYSTEM

[75] Inventor: Joseph F. Rando, Los Altos Hills, Calif.

[73] Assignee: Spectra-Physics, Inc., San Jose, Calif.

[21] Appl. No.: 659,578

[22] Filed: Oct. 11, 1984

[51] Int. Cl.$^4$ .............................................. E04G 3/00
[52] U.S. Cl. ................................... 248/178; 248/183
[58] Field of Search ............... 248/178, 179, 183, 476; 346/108; 33/DIG. 21; 372/101, 107; 362/455; 350/504, 247, 253, 255

[56] References Cited

U.S. PATENT DOCUMENTS

| | | | |
|---|---|---|---|
| 2,424,011 | 7/1947 | Gramont | 248/178 |
| 3,204,471 | 9/1965 | Rempel | 372/107 X |
| 3,279,309 | 10/1966 | Goldberg | 350/253 UX |
| 3,329,060 | 7/1967 | Holleran | 350/253 UX |
| 3,400,596 | 9/1968 | Laich | 372/107 X |
| 3,447,875 | 6/1969 | Goldberg | 350/253 UX |
| 3,467,474 | 9/1969 | Shifrin | 372/107 X |
| 3,541,323 | 11/1970 | Stewart et al. | 372/107 X |
| 4,077,722 | 3/1978 | Bicskei | 350/247 X |
| 4,160,581 | 7/1979 | Weissler | 350/247 X |
| 4,408,830 | 10/1983 | Wutherich | 350/247 |

Primary Examiner—J. Franklin Foss
Attorney, Agent, or Firm—Donald C. Feix; Paul Davis

[57] ABSTRACT

A mounting system for a laser diode enables adjustment of the location of the diode and of the direction of the diode's beam. Fine adjustments may be made of the location of the diode in side-to-side, up-and-down, and forward-and-back directions as well as rotationally for azimuth and tilt angle. A mounting fork is connected to a frame for movement side-to-side on the frame, with two spaced prongs of the fork extending generally vertically. A diode holder block containing the diode is positioned between the prongs and has cylindrical, generally arcuately convex vertical edges engaged between the generally planar surfaces of the forked prongs. This enables the block to be moved for adjustment by sliding and rotational manipulation up-and-down, forward-and-back, rotationally about a vertical axis for azimuth, and rotationally about a generally transverse horizontal axis for tilt.

24 Claims, 6 Drawing Figures

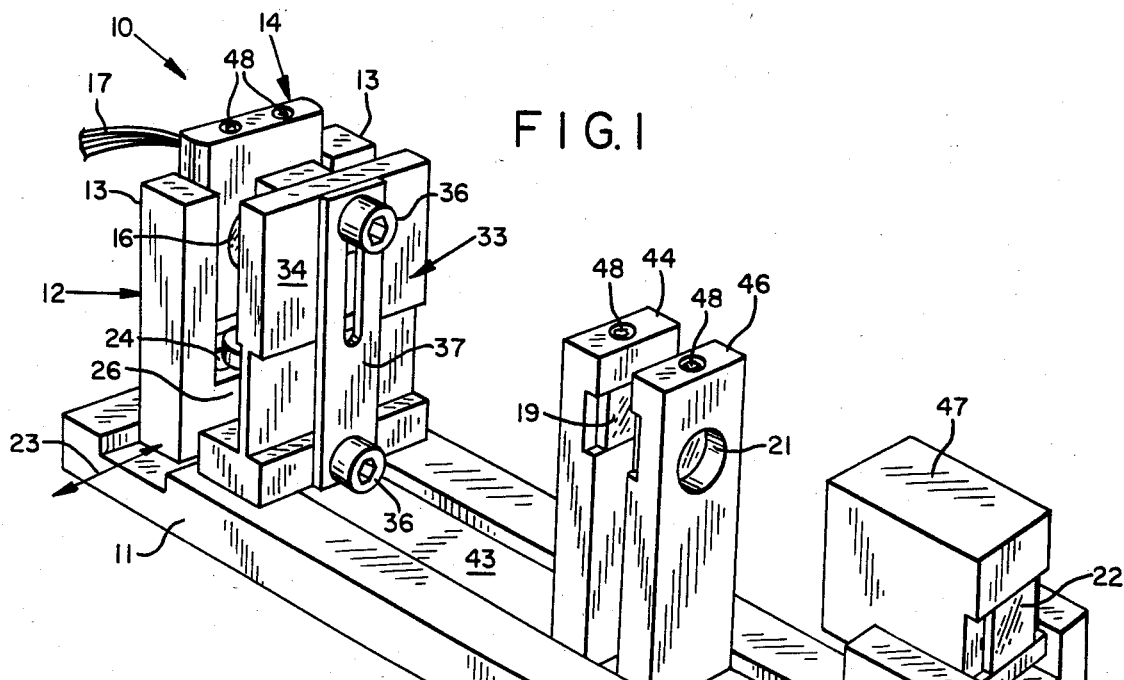
FIG. 1
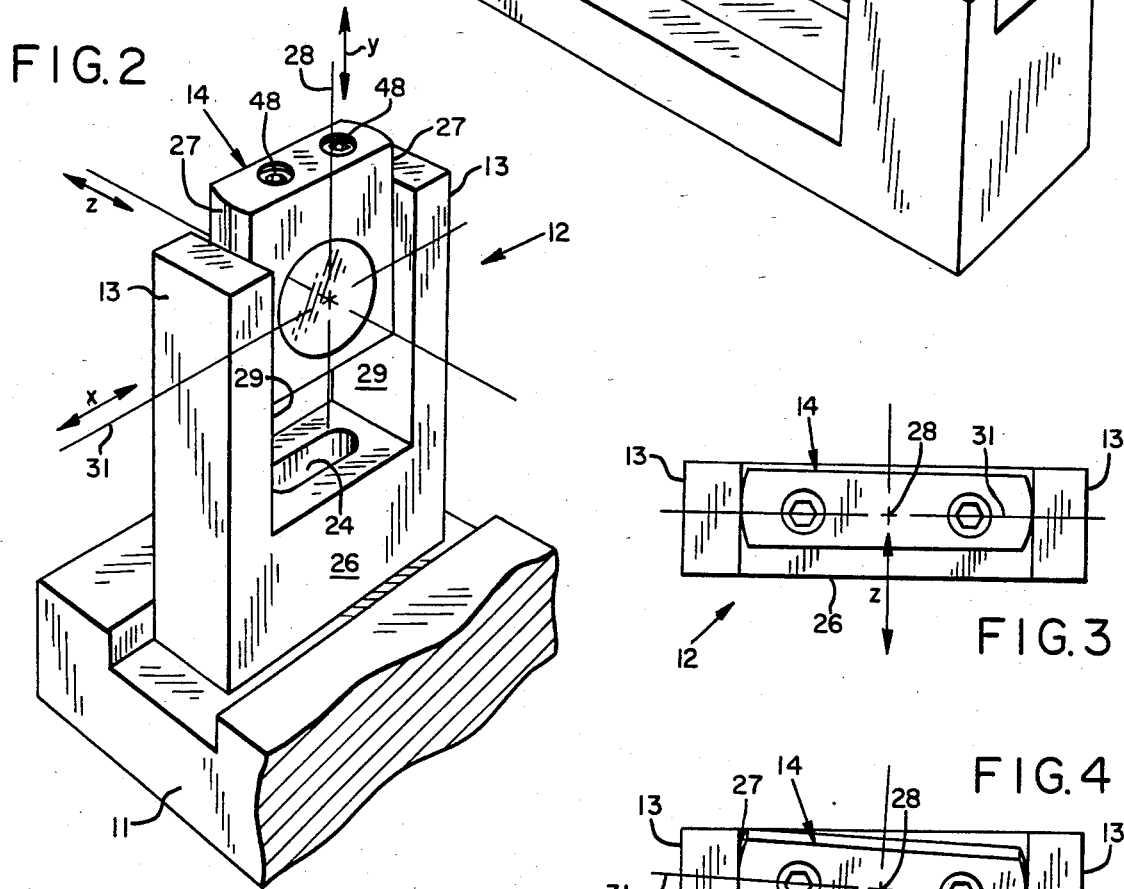
FIG. 2
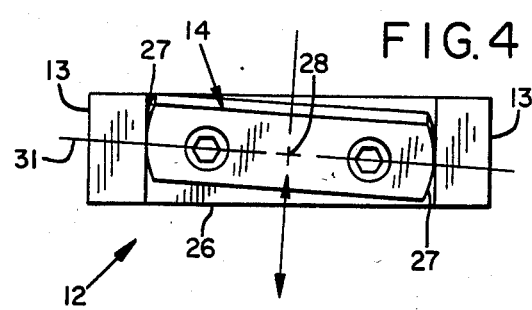
FIG. 3
FIG. 4

LASER DIODE MOUNTING SYSTEM

BACKGROUND OF THE INVENTION

The invention relates to mounting of a diode, and more particularly to a laser diode mounting system permitting precise adjustment of the location and aim of the diode's beam, and with a special lens system in association therewith.

A laser diode projects a beam generally in the shape of an elliptical cone. The shape of the cone, i.e. the divergence angles of the beam, vary considerably from one diode to another due to limitations in the manufacturing procedure. For efficient practical uses of the laser diode, it must be mounted and aimed precisely for maximizing the output power of the beam, and it must be focused with lenses in order to create a focused beam spot of a desired size at a desired location for use, for example, in a laser printer.

Various systems have been proposed and used for mounting, adjusting, and focusing the beam of a laser diode, but none has been as efficient, economical, and yet precise as the system of the present invention described below.

SUMMARY OF THE INVENTION

The laser diode mounting system of the present invention enables precise adjustment of the position and aim of the diode in five movements: X (side-to-side), Y (up-and-down), and Z (forward-and-back) translational directions and rotationally for azimuth and tilt angle.

The mounting system includes a frame or base and a mounting fork with two spaced prongs extending generally vertically. The fork is mounted to the frame in such a way as to permit sliding adjustment movement in the X direction. A generally rectangular diode holder block, containing the forwardly oriented diode, is held between the prongs of the mounting fork. The edges of the diode holder block engage with the surfaces of the fork's prongs in such a way as to permit adjustment by sliding and rotational manipulation between the prongs, providing for the Y and Z direction positional movement as well as rotation about a generally vertical axis for azimuth and rotation about a generally transverse horizontal axis for tilt.

The diode mounting system includes at least one lens in front of the diode, in the path of the diode's beam. One lens is of plastic, which is particularly affected by temperature changes commonly encountered in the ambient air surrounding the diode apparatus. Temperature increases have the effect of increasing focal length. In a preferred form of the invention there is included a temperature compensating mounting means for the plastic lens, for adjusting its Z position in response to changes in temperature, generally in correlation with and in compensation for the changes in focal length caused by the changes in temperature.

The temperature compensation may be achieved with a metallic strip connected to the frame and supporting the plastic lens, preferably comprising aluminum as a rear strip and steel as a forward strip, the steel having a much smaller coefficient of thermal expansion.

Preferably a series of lenses are supported by the frame in front of the diode, in the path of its beam, for collimating, focusing and zoom telescoping of the beam. Track mounting means are provided for at least one of the lenses, for a zoom adjustment of the beam's spot size at a given point forward in the path of the beam, to correct for variations in projected beam angle from one diode to another.

For precise adjustment of the diode in the mounting system of the invention, a special alignment system cooperates with the frame and the diode holder block. This includes a tool having a base with means for fixing the base with respect to the frame of the diode mounting system. The diode holder block has a pair of tapped holes in its top side, into which a pair of threaded screws of the tool are engaged for manipulation of the block. The tool preferably includes rotatable adjustment knobs with threaded adjustment screws for moving the diode holder block in the X, Y and Z directions and for rotating it with respect to the azimuth and tilt angles. A sensor means associated with the alignment system senses the maximum beam output of the diode as the diode holder block is adjusted, to optimize the diode position and aim to achieve maximum output.

The invention facilitates fine adjustment of a laser diode utilizing relatively simple apparatus, as well as providing for compensation for variations in the projected beam angle of diodes from one diode to another by adjustment of the beam's spot size according to prescribed specifications. The invention facilitates the use of an inexpensive plastic lens in the beam path of the diode by compensating for thermal variation in the lens's focal length.

Mounting system apparatus and methods for a laser diode as described above and effective to function as described above comprise further, specific objects of the present invention.

Other and further objects of the present invention will be apparent from the following description and claims and are illustrated in the accompanying drawings which, by way of illustration, show preferred embodiments of the present invention and the principles thereof and what are now considered to be the best modes contemplated for applying these principles. Other embodiments of the invention embodying the same or equivalent principles may be used and structural changes may be made as desired by those skilled in the art without departing from the present invention and the purview of the appended claims.

DESCRIPTION OF THE DRAWINGS

FIG. 1 is a perspective view showing a laser diode mounting system according to the invention, including a frame to which the diode and a series of lenses are connected.

FIG. 2 is a view in perspective showing a diode mounting fork and a diode holder block, the position of which can be manipulated within the fork, comprising a part of the apparatus of FIG. 1.

FIGS. 3 and 4 are top plan views of the fork and diode holder block, indicating directions of maneuverability of the diode holder block.

DESCRIPTION OF THE PREFERRED EMBODIMENTS

Figure 5:
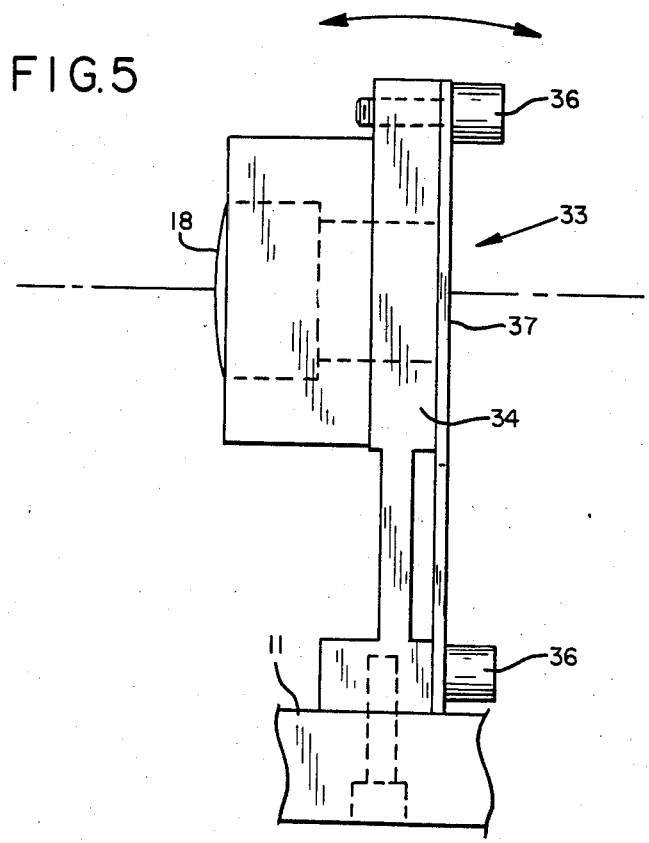
FIG. 5 is a side elevation view of the assembly, particularly illustrating a temperature compensating mounting for a lens.

In the drawings, FIG. 1 shows a laser diode adjustable mounting system 10 including a frame or base 11 and a mounting fork 12 connected to the frame, with a pair of generally vertical prongs 13, between which is engaged a diode holder block 14 containing a laser diode 16.

The diode 16, when energized via wire leads 17, projects forward a beam which passes through a series of lenses 18, 19, 21 and 22. The emerging beam from the last lens 22 must be in focus and of a prescribed spot size at a prescribed distance forward of the lens 22 for the particular use intended, e.g. in a laser printer.

The mounting fork 12 is slideably adjustable in the side-to-side direction indicated by an arrow 23 in FIG. 1, i.e. an X direction as characterized herein and in the appended claims. This movement may be facilitated by a slotted hole 24 in a base portion 26 of the fork. The slotted hole 24 receives a bolt which passes through and connects to a threaded hole (not shown) in the frame 11. In this way, the diode 18 may be adjusted for correct position in the X direction. This movement is also indicated in FIG. 2.

The adjustment movements associated with the diode holder block are illustrated in FIGS. 2, 3 and 4. As shown, the side edges 27 of the block 14 are curved to facilitate movement about a generally vertical axis 28. The edges 27 are cylindrically convex as illustrated.

The diode holder block 14 is engaged tightly between the relatively rigid but yieldable prongs 13 of the fork 12. The facing surfaces 29 of the prongs may be planar and generally vertical for engagement with the curved edges 27 of the mounting block.

As illustrated in FIGS. 2, 3 and 4, the diode holder block 14 may be rotated about a generally horizontal axis 31 between the prongs 13 of the fork 12 for tilt adjustment, as well as about the generally vertical axis 28 for azimuth adjustment. In addition, it may be moved in up-and-down directions, characterized as a Y direction herein and in the claims, and also forward-and-back in a Z direction as indicated. The movement of the fork 12 with respect to the frame 11 provides the X adjustment movement, as noted above, for a total of five degrees of freedom. Combinations of the five movements may be made, i.e. combinations of positional adjustments and rotational aim adjustments, to achieve the optimum position and aim of the diode 16.

FIG. 5 shows a portion of the assembly 10 in side elevation view. At least one of the lenses in the series of lenses 18, 19, 21, 22 in the path of the diode's projected beam may be a plastic lens. Plastic lenses have certain advantages, but they expand and contract considerably with changes in temperature, affecting their focal lengths. Higher ambient temperatures cause the plastic lens to expand and have the effect of increasing the focal length. The system 10 according to the invention includes a means for automatically compensating for thermal changes in focal length of a plastic lens, which may be used as the lens 18. A holder 33 for the plastic lens 18 preferably comprises a bi-metallic strip, including an aluminum main portion 34 at the rear, to which is secured, by glueing or a pair of screws 36 as shown in the drawings, a steel (preferably stainless) strip 37. The strip 37 has a central opening through which this diode's beam passes. When ambient temperature rises, increasing the focal length of the lens 18, the holder 34 automatically compensates by bending forward to a commensurate degree. This is caused by the much greater expansion of the aluminum portion 34 than the steel portion 37, the latter having a much lower coefficient of thermal expansion.

Figure 6:
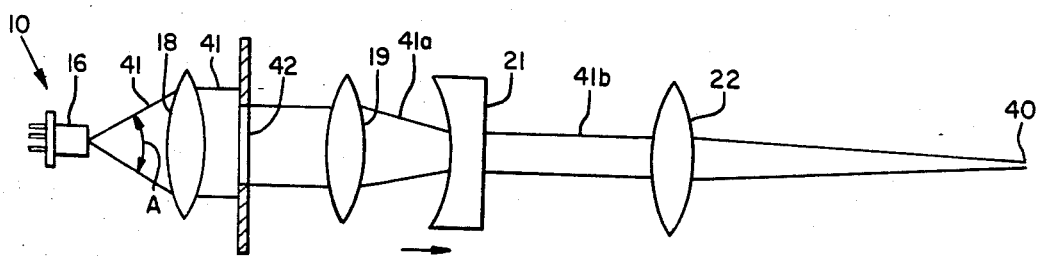
FIG. 6 is a diagrammatic top plan view showing elements of the laser diode system and illustrating the function of zoom lenses in the system for achieving a desired spot size.

FIG. 6 is a diagrammatic plan view showing elements of the laser diode mounting system 10 and illustrating another feature associated with the system. As noted above, the diodes as manufactured vary considerably in their beam divergence angles. They project a generally elliptical conical beam, varying in major and minor angles of projection. A diode beam angle A is shown in FIG. 6. The beam must ultimately be brought to a specified spot size at a position 40 forward of the assembly 10, with the beam in focus at that point.

In the form of the invention illustrated and described herein, the beam is brought to the specified spot size by the use of zoom optics. Beam power is optimized without overly complex and expensive apparatus.

The elliptical conical beam 41 emerging from the diode 16 first passes through the lens 18, a convex lens which may be partially cylindrical for partial collimation of the beam. The beam is less divergent and may be generally parallel leaving the lens 18. It passes through an aperture 42 which only eliminates disk rings, having little effect on the usable beam diameter. The aperture is built into the lens holder 33.

The next two lenses 19 and 21 encountered by the beam are zoom lenses for adjusting the beam's spot size and compensating for variance in projected beam angles from one diode to the next, for consistency in spot size. As illustrated in FIG. 6, the convex lens 19 produces a converging beam 41a which then passes through the concave lens 21 to produce a substantially parallel emerging beam 41b. The size or diameter of this beam 41b can be adjusted by moving the lenses 19 and 21 closer together (larger) or farther apart (smaller). Adjustment of the position of the lens 21 simply intercepts the converging beam 41a from the lens 19 at different points at different beam diameters, affecting the size of the output beam 41b. Thus, the zoom optics compensate for the differences in divergence angle A from one diode to the next by producing a beam at 41b of consistent specified size.

As indicated in FIG. 1, a track 43 preferably is included in the frame 11 of the mounting system, within which holders 44 and 46, respectively, for the lenses 19 and 21 are slideable in the Z direction.

The final lens 22 encountered by the beam is in a fixed position on the frame 11, retained in a fixed holder 47. The lens 22 focuses the beam at the spot 40.

The adjustment manipulation of the diode holder block 14 and the fork 12, as well as the adjustments of the lens holder 44 and/or 46 of the lenses 19 and 21, are accomplished by a special alignment system (not illustrated) which includes a series of fine adjustment devices. The alignment system is a tool having a base connectable to the frame 11 of the diode mounting system 10, for fixing the position of the tool with respect to the mounting frame 11. The tool has threaded screws which are tightened into threaded holes 48 in the top of the diode holder block 14 and the top of the lens holders 44 and 46. The adjustment devices on the alignment system are fine-threaded tuning knobs which are rotated to manipulate the position and angle of the diode mounting block and fork through all five degrees of freedom. Additional tuning knobs are provided for the lens holder 44 and/or 46, for the zoom adjustment feature.

All adjustments are accomplished with the diode 16 electrically powered and projecting a beam, so that the beam can be positioned, aimed and finely tuned dynamically to achieve maximum power output and performance up to specifications. The zoom lens holders 44 and/or 46 are also adjusted with the diode powered, so that the focused beam can be achieved in the desired spot size at the point 40, through actual measurement during adjustment. The alignment system may include a beam power sensor for achievement, dynamically, of the desired maximum power output.

When all adjustments have been made and the beam performs according to specifications, the components are locked in place. This is preferably accomplished with adhesive bonding agents. For example, the fork 12 may be locked in position (against X direction movement), and the diode holder block 14 may be locked in place, using a few drops of a wicking anaerobic adhesive, such as Loctite (manufactured by Loctite Corporation of Newington, Conn.). In addition, the fork 12 is tightened onto the frame by the bolt passing through the slotted hole 24.

The two zoom lens holders 44 and 46, in the sliding adjustment track 43, may be fixed in place using a suitable epoxy adhesive.

While we have illustrated and described the preferred embodiments of our invention, it is to be understood that these are capable of variation and modification, and we therefore do not wish to be limited to the precise details set forth, but desire to avail ourselves of such changes and alterations as fall within the purview of the following claims.

I claim:

1. A laser diode adjustable mounting system for adjusting the location of the diode and for directing the beam of the diode in X (side-to-side), Y (up-and-down) and Z (forward-and-back) directions as well as rotationally for azimuth and tilt angle, said mounting system comprising, a frame, a mounting fork with two spaced prongs extending generally vertically, fork mounting means for connecting the fork to the frame and for permitting adjustment movement in the X direction, and a generally rectangular diode holder block containing the diode oriented forwardly, the block having cylindrical, generally arcuate, convex vertical edges which are engaged between the prongs of the mounting fork;

whereby the diode holder block may be moved for adjustment by sliding and rotational manipulation between the prongs, (a) up-and-down, in the Y direction, (b) forward-and-back, in the Z direction, and (c) rotationally about a generally vertical axis for azimuth, and (d) rotationally about a generally transverse horizontal axis for tilt.

2. The laser diode mounting system of claim 1, further including at least one lens in front of the diode in the path of its beam, comprising a plastic lens or any other optical material with a temperature coefficient and including temperature compensating mounting means for automatically adjusting the Z position of the plastic lens in response to changes in temperature, generally in correlation with and compensating for changes in focal length of the plastic lens caused by said changes in temperature.

3. The laser diode mounting system of claim 2, wherein the temperature compensating mounting means comprise a metallic strip connected to a frame of different metallic material supporting the lens.

4. The laser diode mounting system of claim 1, further including a series of lenses connected to the frame in front of the diode, in the path of its beam, for collimating, focussing and zoom telescoping of the beam, including track mounting means for forward-and-back sliding adjustment moving of at least one lens for zoom adjustment of the beam's spot size at a given point forward in the path of the beam, to correct for variations in projected beam from one diode to another.

5. The laser diode mounting system of claim 4, wherein one of the series of lenses is a plastic lens, and including temperature compensating mounting means for automatically adjusting the Z position of the plastic lens in response to changes in temperature, generally in correlation with and compensating for changes in focal length of the plastic lens caused by said changes in temperature.

6. The laser diode mounting system of claim 5, wherein the temperature compensating mounting means comprise a steel strip connected to an aluminum frame and supporting the plastic lens.

7. The laser diode mounting system of claim 1, wherein the diode holder block includes a pair of tapped holes in its top side for manipulation by an alignment tool for the diode, whereby the diode may be energized to project the beam and the mounting block and fork position may be dynamically adjusted to finely tune the position and aim of the diode to maximize beam output.

8. The laser diode mounting system of claim 1, further including an alignment system for adjusting the position and aim of the diode with the diode energized and producing a beam, including a tool having a base with means for fixing the base with respect to the frame of the diode mounting system and having a pair of threaded screws, the diode holder block having a pair of tapped holes in its top side for threaded engagement with the threaded screws, the tool including threaded adjustment means for moving the diode holder block in the X, Y and Z directions and for rotating it with respect to the azimuth and tilt angles, and including sensor means for sensing the maximum beam output as the diode holder block is adjusted.

9. In a laser diode assembly wherein a laser diode connected to a frame projects a beam which passes through at least one lens, the improvement comprising a plastic lens in the beam path with temperature compensating mounting means for adjusting the forward-and-back position of the plastic lens in the beam path automatically in response to changes in temperature, generally in correlation with and in compensation for changes in focal length of the plastic lens caused by the changes in temperature.

10. The improvement of claim 9, wherein the temperature compensating mounting means comprises a metallic strip connected to the frame and supporting the plastic lens.

11. The improvement of claim 10, wherein the metallic strip comprises an aluminum strip and a stainless steel strip connected to the forward side of the aluminum strip.

12. A mounting system for holding a laser diode assembly in a laser diode system of the kind in which the position of the diode is adjustable to maximize the effective power output of the diode by controlling the direction and position of the output beam of the diode with respect to lenses positioned forward of the diode in the beam path, said mounting system comprising, frame means for holding the diode assembly in an adjusted location and direction, fork means connected within the frame means and having spaced apart vertically extending prongs, block means for holding the diode assembly within the fork means, said block means having side elements which are engagable with coacting surfaces of the spaced apart prongs of the fork means, and adjustment means associated with the fork means, the prongs and the frame means for permitting sliding side-to-side, up-and-down, forward-and-back, azimuth and tilt adjustment of the diode assembly, including means permitting both controlled sliding and controlled rotational movement between the block and the fork means.

13. A mounting system according to claim 12, wherein said adjustment means includes a curved, convex surface shape on the side elements, and said coacting surface of the prongs being substantially flat, enabling the up-and-down, forward-and-back, asimuth and tilt adjustment of the diode, comprising said controlled sliding and controlled rotational movement.

14. A mounting system according to claim 12, wherein said adjustment means includes fork mounting means connecting the fork means to the frame means and permitting side-to-side adjustment movement of the fork means with respect to the frame means.

15. A method of adjusting the position and aim of a laser diode in a laser of the kind in which the laser diode produces an output beam which needs to be repositioned and re-aimed in order to obtain the benefit of the maximum power of the output beam, said method comprising, mounting the diode in a block, holding the block between two upright prongs of a fork, mounting the fork in a base which permits side-to-side movement of the fork within the base, shaping the coacting surfaces of the block and the prongs so that the block can be slipped upwardly and downwardly and forward and back between the prongs and can be slippingly rotated to a limited extent about a first axis extending vertically and about a second axis extending horizontally through the block, and adjusting the diode by manipulating the block through movement along three axes and through aim adjustment for azimuth and tilt.

16. The method of claim 15, further including the step of fixing the adjusted position of the block between the prongs and the adjusted position of the fork on the base by putting a wicking liquid adhesive at the contacting surfaces.

17. A method for adjusting the position of a laser diode and for directing the beam of the diode for precisely directing the beam for maximum power, said method comprising, mounting the diode in a diode block, holding the diode block between two upright prongs of a fork, with the prongs urged against the edges of the diode block, connecting the fork to a base, providing, between the two connections of the fork to the base and the diode block to the prongs of the fork, for sliding adjustment movement of the diode block and the diode itself in X (side-to-side), Y (up-and-down) and Z (forward-and-back) directions as well as rotationally for both azimuth and tilt angle, and making the adjustment in X, Y and Z directions and for beam aim in azimuth and tilt.

18. The method of claim 17, wherein the adjustment is made dynamically, with the diode energized and projecting the beam.

19. The method of claim 17, wherein the fork is connected to the base so as to permit X direction movement of the fork with respect to the base, and including shaping the coacting surfaces of the diode block and the prongs to permit Y and Z movement and azimuth and tilt angular adjustment of the diode block between the prongs.

20. The method of claim 19, wherein the diode block is shaped with cylindrical, generally arcuately convex vertical edges, between relatively flat vertical coacting surfaces of the prongs.

21. The method of claim 19, further including the step of fixing the adjusted position of the laser diode by applying at the contacting surfaces of said two connections a wicking liquid adhesive.

22. In a laser diode system wherein a beam is projected from a laser diode to a forward location at which the beam should form a desired spot size, a method of compensating for variations in the projected beam angle of the diode from diode to diode by adjustment of the beam's spot size at said forward location, comprising, providing a plurality of lenses in front of the diode, connected to a frame and positioned in the path of the beam, with at least one of the lenses being mounted on the frame for forward-and-back sliding adjustment movement, adjusting the forward-and-back position of the one lens for zoom telescoping of the beam to adjust the spot size at said forward location, and fixing the lens in the adjusted position when the desired spot size is achieved.

23. An adjustable mounting system for an optical element whose position and aim are critical in an optical system, for adjusting the location and alignment of the optical element in X (side-to-side), Y (up-and-down) and Z (forward-and-back) directions as well as rotationally for azimuth and tilt angle, said mounting system comprising, a frame, a mounting fork with two spaced prongs extending generally vertically, fork mounting means for connecting the fork to the frame and for permitting adjustment movement in the X direction, and a generally rectangular optical element holder block containing the optical element oriented forwardly, the block having cylindrical, generally arcuate, convex vertical edges which are engaged and gripped between the prongs of the mounting fork, whereby the optical element holder block may be moved for adjustment by sliding and rotational manipulation between the prongs (a) up-and-down, in the Y direction, (b) forward-and-back, in the Z direction, (c) rotationally about a generally vertical axis for azimuth, and (d) rotationally about a generally transverse horizontal axis for tilt.

24. A method of adjusting the position and aim of an optical element, comprising,
mounting the optical element in a block,
holding the block between two upright prongs of a fork,
mounting the fork in a base which permits side-to-side movement of the fork within the base,
shaping the coacting surfaces of the block and the prongs so that the block can be slipped upwardly and downwardly and forward and back between the prongs and can be slippingly rotated to a limited extent about a first axis extending vertically and about a second axis extending horizontally through the block, and
adjusting the optical element by manipulating the block through movement along three axes and through aim adjustment for azimuth and tilt.

* * * * *